(12) United States Patent
Kalenine

(10) Patent No.: US 8,160,829 B2
(45) Date of Patent: Apr. 17, 2012

(54) CURRENT MEASURING DEVICE AND PROCESSING UNIT COMPRISING ONE SUCH DEVICE

(75) Inventor: Yvan Kalenine, Meylan (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 409 days.

(21) Appl. No.: 12/453,719

(22) Filed: May 20, 2009

(65) Prior Publication Data

US 2009/0312970 A1 Dec. 17, 2009

(30) Foreign Application Priority Data

Jun. 11, 2008 (FR) ...................... 08 03249

(51) Int. Cl.
- G01R 15/00 (2006.01)
- G01R 19/00 (2006.01)
- G01R 31/08 (2006.01)
- H02H 9/00 (2006.01)
- H02H 3/08 (2006.01)
- H02J 1/04 (2006.01)

(52) U.S. Cl. .............. 702/64; 702/57; 324/522; 361/54; 361/93.1; 307/35

(58) Field of Classification Search ................... 702/57, 702/64; 361/5, 13, 35, 54, 57, 87, 90, 91.1, 361/91.6, 93.9, 93.1; 324/522; 307/31, 24, 307/32–37, 52, 60–63, 100, 131
See application file for complete search history.

(56) References Cited

U.S. PATENT DOCUMENTS

| | | | | |
|---|---|---|---|---|
| 4,656,554 A | * | 4/1987 | Maschek et al. ................. | 361/56 |
| 4,847,780 A | * | 7/1989 | Gilker et al. ..................... | 702/64 |
| 7,276,893 B2 | | 10/2007 | Banaska et al. ................. | 324/115 |

FOREIGN PATENT DOCUMENTS

| | | |
|---|---|---|
| EP | 0 724 161 A2 | 7/1996 |
| EP | 0 977 041 A | 2/2000 |
| FR | 2 883 380 A | 9/2006 |
| GB | 2 336 217 B | 6/2002 |
| JP | 2000 162248 A | 6/2000 |

* cited by examiner

Primary Examiner — Mohamed Charioui
Assistant Examiner — Ricky Ngon
(74) Attorney, Agent, or Firm — Steptoe & Johnson LLP

(57) ABSTRACT

The current measuring device comprises a first measuring resistor to receive a measurement current, and a first signal amplifier having an input connected to said first measuring resistor and an output to provide a first measurement signal. A second measuring resistor is connected in series with said first measuring resistor, and first voltage limiting means are connected in parallel on the first measuring resistor to branch a first shunt current off when a first limiting voltage is reached on said first measuring resistor. The value of the first measuring resistor is greater than the value of the second measuring resistor A processing unit comprises one such current measuring device.

10 Claims, 3 Drawing Sheets

CURRENT MEASURING DEVICE AND PROCESSING UNIT COMPRISING ONE SUCH DEVICE

BACKGROUND OF THE INVENTION

The invention relates to a current measuring device comprising:
- a measuring resistor to receive a measurement current from a current sensor, and
- a signal amplifier having an input connected to said measuring resistor and an output to provide a measurement signal representative of a current to be measured.

STATE OF THE ART

Known current measuring devices such as the one represented in FIG. 1 generally comprise a measuring resistor 1 of low value to receive a current to be measured. In order to greatly reduce the value of the measuring resistor, devices with a wide dynamic measuring range also comprise a signal amplifier 2 connected to the measuring resistor to amplify the signal of weak value due to the very low value of the measuring resistor. An analog-to-digital signal converter connected to an output of the amplifier provides a digital signal representative of the current flowing through the measuring resistor. Generally, the measuring resistor and the amplifier input are protected by a voltage surge limiter 4. When the measuring device is used for measuring strong AC currents, a current transformer 5 comprises a primary circuit designed to have a current to be measured flow through the latter and a secondary winding to supply a measurement current to the resistor 1.

The use of measuring resistors of weak values enables the circuits on which the current is measured not to be disturbed. In particular, when a current transformer is used, a weak measuring resistor on the secondary prevents the magnetic circuit of said transformer from being saturated.

However weak resistance values require the use of high-gain signal amplifiers. It is possible to dispose several amplification stages, suitable for the different current levels flowing in the resistor, on resistor 1. Large gains also cause amplification of the noise and of the stray signals that are particularly present in industrial environments. Increasing the gain also leads to excessive amplification of the offset of the amplifier or of the other electronic circuits. Automatic amplifier gain controls do exist. However, these complex and not very dependable circuits also introduce large measurement errors.

SUMMARY OF THE INVENTION

The object of the invention is to provide a current measuring device having a wide dynamic measuring range, a weak input impedance, and a simple and dependable structure. It is a further object of the invention to provide a processing unit comprising one such measuring device.

A current measuring device according to the invention comprises:
- a first measuring resistor to receive a measurement current,
- a first signal amplifier having an input connected to said first measuring resistor and an output to provide a first measurement signal,
- a second measuring resistor connected in series with said first measuring resistor, and
- first voltage limiting means connected in parallel on the first measuring resistor to branch a first shunt current off when a first limiting voltage is reached on said first measuring resistor, the value of the first measuring resistor being greater than the value of the second measuring resistor.

In a preferred embodiment, the measuring device comprises second voltage limiting means connected in parallel on the second measuring resistor to branch a second limiting current off when a second limiting voltage is reached on said second measuring resistor.

In a particular embodiment, the measuring device comprises a second signal amplifier connected to the second measuring resistor to provide a second measurement signal, said first amplifier having a higher gain than the gain of said second amplifier.

The first limiting means preferably have a limiting voltage of less than 1 volt for a shunt current of less than 1 amp. Advantageously, the first limiting means comprise two diodes connected head-to-tail in reverse parallel.

The second limiting means preferably have a limiting voltage of less than 2 volts for a shunt current of less than 2 amps. Advantageously, the second limiting means comprise two groups of two diodes in series connected head-to-tail in reverse parallel.

Preferably a ratio between a first gain channel composed of the first measuring resistor, the second measuring resistor and the amplification of said first amplifier over a second gain channel composed of the second measuring resistor and the amplification of said second amplifier is equal to approximately the square root of a dynamic measuring range defined by a maximum value of a current to be measured compared with a minimum value of a current to be measured.

Advantageously, a ratio between a value of said first measuring resistor and a value of said second measuring resistor is comprised between 5 and 15.

Advantageously, a ratio between an amplification of said first amplifier and an amplification of the second amplifier or of the second gain channel is comprised between 5 and 20.

A processing unit according to the invention comprises:
- at least one current transformer comprising a primary circuit to receive a primary current to be measured and a secondary winding to supply a secondary measurement current representative of said primary current to be measured,
- at least one current measuring device connected to the secondary winding of said current transformer to measure said secondary current and to provide a measurement signal representative of the secondary current,
- processing means connected to said measuring device to receive said measurement signal, said at least one measuring device is a measuring device as defined above receiving the secondary measurement current and providing:
  - a first measurement signal representative of a current flowing in the first measuring resistor, and
  - a second measurement signal representative of a current flowing in the second measuring resistor.

BRIEF DESCRIPTION OF THE DRAWINGS

Other advantages and features will become more clearly apparent from the following description of particular embodiments of the invention, given as non-restrictive examples only and represented in the accompanying drawings in which.

DETAILED DESCRIPTION OF PREFERRED EMBODIMENTS

Figure 1:
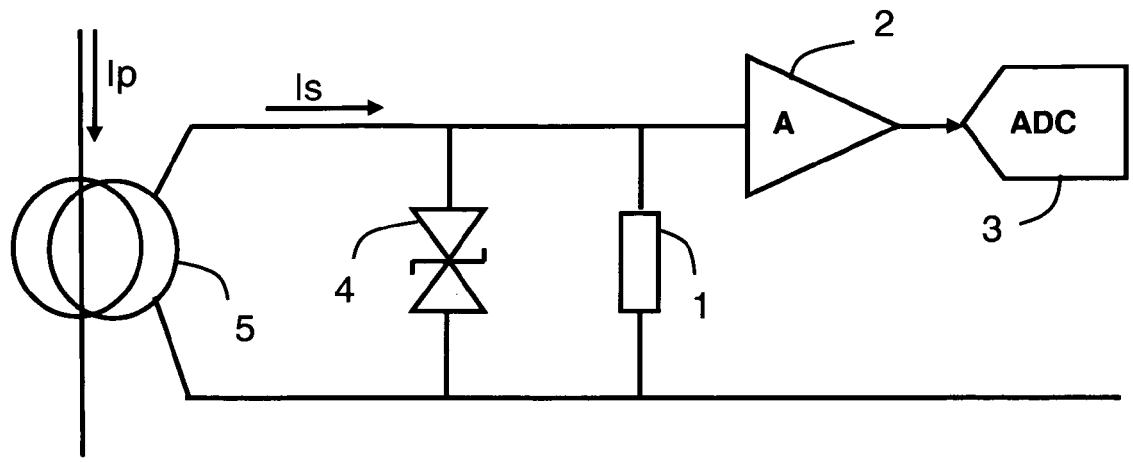
FIG. 1 represents a diagram of a current measuring device according to the state of the art.
Figure 2:
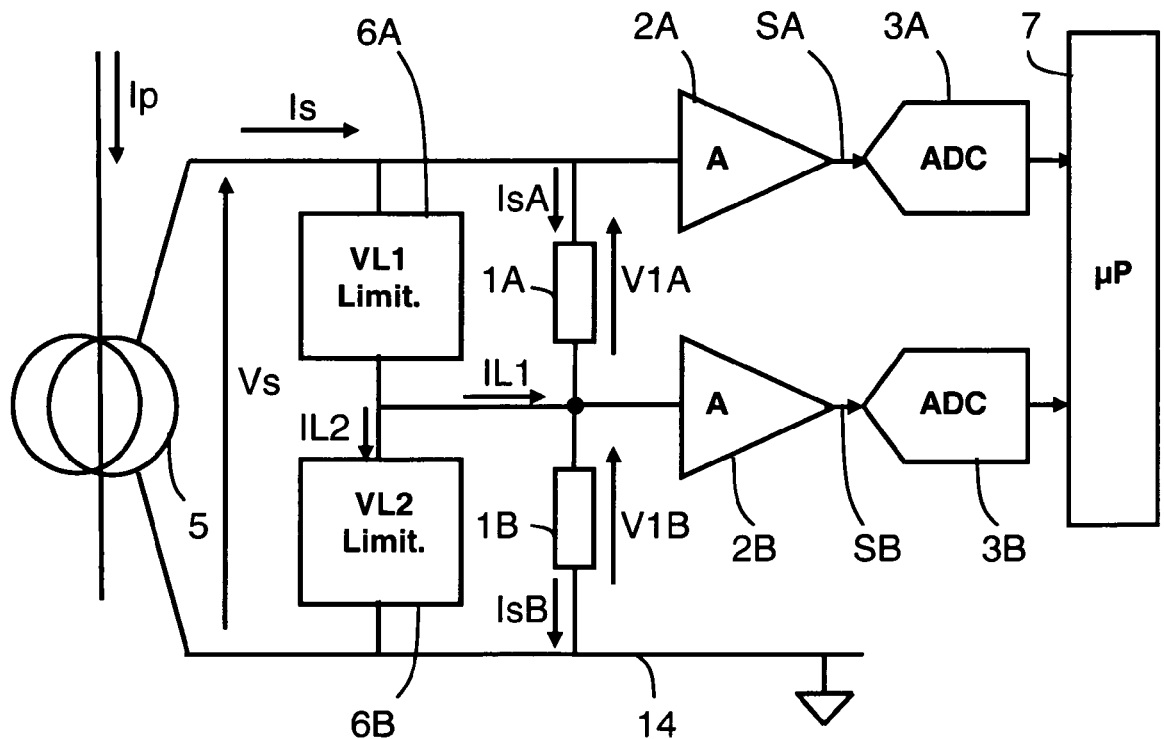
FIG. 2 represents a first diagram of a current measuring device according to an embodiment of the invention.

A current measuring device according to an embodiment of the invention described in FIG. 2 comprises a first measuring resistor 1A to receive a measurement current IsA, and a first signal amplifier 2A having an input connected to said first measuring resistor 1A and an output to provide a first measurement signal SA. According to this embodiment of the invention, the device advantageously comprises a second measuring resistor 1B connected in series with said first resistor 1A, the value of first measuring resistor 1A being greater than the value of second measuring resistor 1B. The first measuring resistor 1A is designed for measuring weak currents whereas resistor 1B of very low value is designed for measuring strong currents. A first voltage limiter 6A is connected in parallel on first measuring resistor 1A of higher value to branch off a shunt current IL1 to second measuring resistor 1B as soon as a first voltage threshold VL1 is exceeded.

In the device represented in FIG. 2, for very weak currents, almost all of the measurement current Is flows via first resistor 1A and via second resistor 1B of very low value. A first voltage V1A is thereby generated on first resistor 1A and a second voltage V1B is generated on second resistor 1B. As the value of resistor 1A is greater than the value of resistor 1B, voltage V1A is higher than voltage V1B. When the measurement current increases, voltage V1A increases in the same proportions. Then, as soon as the threshold VL1 of the first voltage limiter is exceeded, a current IL1 is branched off from first resistor 1A to be applied directly to second resistor 1B. In this case, the current Is is divided between a current IsA flowing in resistor 1A and a current IL1 flowing via first voltage limiter 6A, these two currents IsA and IL1, the sum of which corresponds to the current Is, being found in second measuring resistor 1B. At this current level, the voltage on resistor 1A is limited and the current measuring channel is the one that uses the second resistor 1B only. Return of the current Is takes place via a reference line 14.

Such a device enhances:
- measurement of weak currents with resistor 1A of medium value or series connection of resistors 1A and 1B combined with the use of a medium-gain amplifier,
- limiting of the voltage on the first measuring resistor to privilege current flow to second measuring resistor 1B and to limit the input impedance of the measuring device in case of strong currents, and
- measurement of strong currents on second measuring resistor 1B only having a low value.

The device of FIG. 2 also comprises a second voltage limiter 6B connected in parallel on second measuring resistor 1B to limit the voltage VB1 on second measuring resistor 1B to a second limiting value VL2 for very strong currents Is able to exceed the measuring dynamic range. This second limiter 6B further improves the weak impedance by making it low for any current value. Thus, when the voltage VL2 on resistor 1B is exceeded, a current IL2 flows in voltage limiter 6B. A total voltage Vs on resistors 1A and 1B in series is limited to the sum of the limiting voltages VL1 and VL2 of voltage limiters 6A and 6B even for very high currents exceeding the measuring range.

Advantageously, a second signal amplifier 2B connected to the second measuring resistor enables a second amplified measurement signal to be provided, said first amplifier 2A having a higher gain than the gain of said second amplifier 2B.

The output signals SA and SB from first and second amplifiers 2A and 2B are preferably applied to inputs of converters for analog-to-digital conversion respectively 3A and 3B. Digital signals on output from the converters are supplied to a processing circuit 7. Circuit 7 can in particular be a microprocessor, a microcontroller or a hybrid circuit that can be tailor-made.

Figure 3:
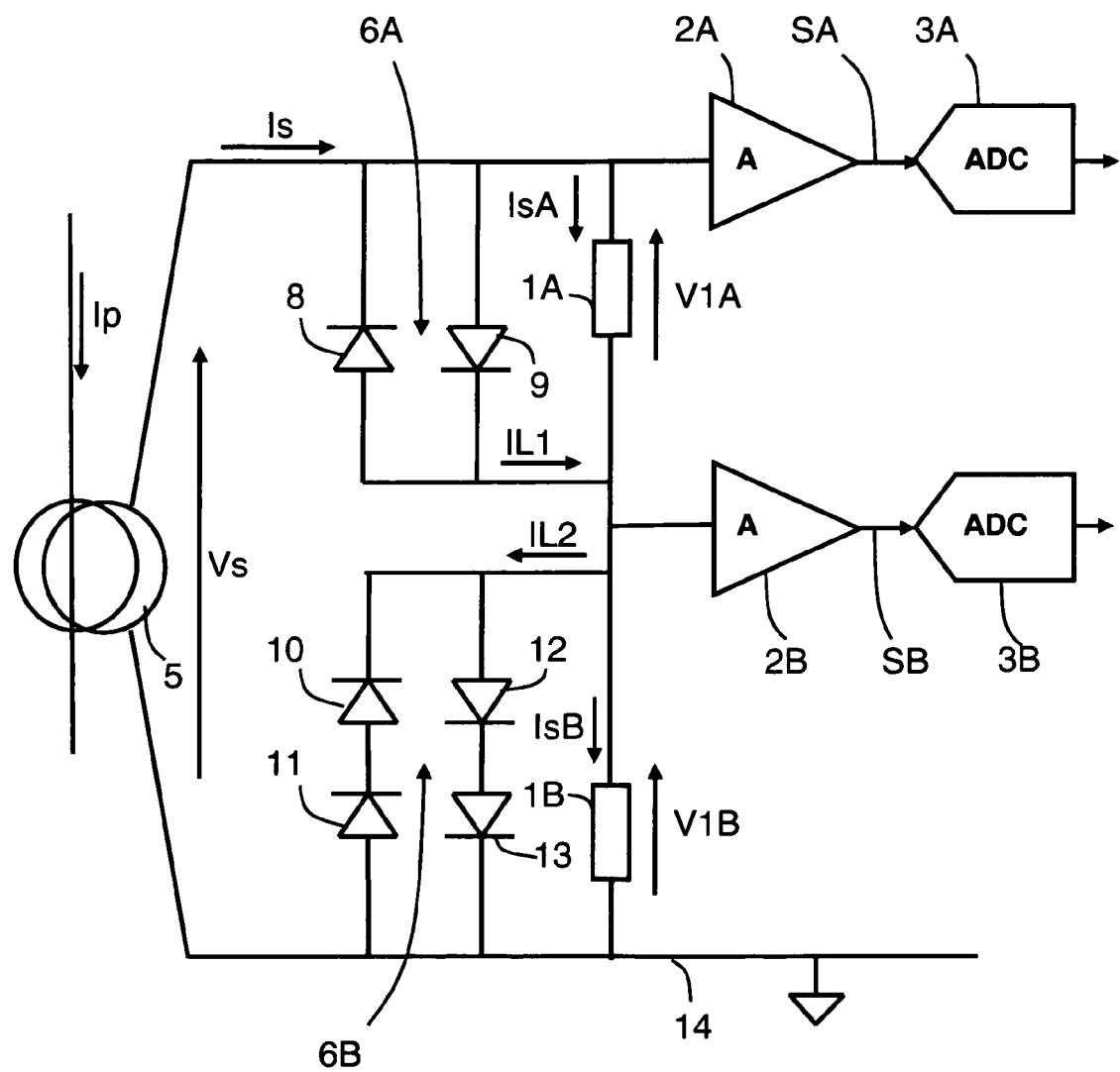
FIG. 3 represents a second diagram of a current measuring device according to an embodiment of the invention.

The first voltage limiter preferably has a limiting voltage of less than 1 volt for a shunt current of less than 1 amp. As represented in FIG. 3, the first voltage limiter comprises two diodes 8 and 9 connected head-to-tail in reverse parallel. In this embodiment, the limiting voltage corresponds to a diode DC voltage. Head-to-tail connection makes it possible to act two-directionally in AC.

The second voltage limiter preferably has a limiting voltage of less than 2 volts for a shunt current of less than 2 amps. In the embodiment of FIG. 3, the second voltage limiter comprises two groups of two diodes 10, 11 and 12, 13 in series connected head-to-tail in reverse parallel. The limiting voltage then corresponds to the sum of two diode DC voltages able to act two-directionally in AC.

In the embodiment of FIGS. 2 and 3, there is a first gain channel corresponding to the value of the first resistor to which the value of the second measuring resistor depending on the layout used is added and to the amplification value of the first amplifier, and a second gain channel corresponding to the value of the second resistor and to the value of the second amplifier if used. Advantageously, a ratio between a first gain channel composed of the first measuring resistor, the second measuring resistor and the amplification of said first amplifier over a second gain channel composed of the second measuring resistor and of the amplification of said second amplifier is equal to approximately the square root of a dynamic measuring range defined by a maximum value of a current to be measured compared with a minimum value of a current to be measured.

For example, if the maximum value of a current to be measured is equal to 40 times a rated current In, if the minimum value of a current to be measured is equal to 0.1 times the rated current and if current sensors such as transformers are two of 1-amp and 5-amp types, then the dynamic measuring range is $(40/0.1)*(5/1)=2000$. For optimal use of the converters, each converter will have to process a dynamic range equal to the square root of the measuring dynamic range i.e. in the example about 45. The ratio between the gain channels can be distributed between the ratio of the amplifier amplitudes and the ratio between the resistors or groups of resistors (1A+1B) over the value of the weakest resistor 1B. In the case where the second gain channel, formed by resistor 1B with a second amplifier 2B with a gain of 1 or without an amplifier, has a gain of 1, the first channel, formed by resistors 1A and 1B and by amplifier 2A, has a gain of 45. This gain of 45 is advantageously distributed between the values of resistors 1A and 1B and the amplification of amplifier 2A. In this example, if the reference resistor 1B has 1 ohm, resistor 1A can have 6.5 ohms and the amplification of the first amplifier can be 6.

The first channel has a gain of $((1+6.5)*6)=45$ and enables the converter to process weak signals of relative level 1 to 45 with precision with a useful dynamic range of 45. The second channel has a gain $(1*1)=1$ and enables the converter to process strong signals of relative level 45 to 2000 with a useful dynamic range of 45.

In these embodiments of the invention, the ratio between a value of said first measuring resistor 1B and a value of said second measuring resistor 1A is comprised between 5 and 15. Advantageously, the ratio between an amplification of first amplifier 2A and an amplification of the second amplification channel is comprised between 5 and 20. The second amplification channel can have an amplifier, but with a gain of 1 it can be exempt from amplifying.

In the embodiments of FIGS. 2 and 3, the references of the gain channels can be considered starting from the sum of the two resistors 1A and 1B. In this case, the first gain channel corresponds to amplification by the first amplifier and the second gain channel corresponds to attenuation caused by the resistive divider formed by resistors 1A and 1B connected in series and the common mid-point and the output for the second signal to be applied to a second amplifier 2B if applicable. In an identical example to the one set out above, the first gain channel has the amplification value 6 and the second gain channel is an attenuation of the divider bridge i.e. (1B/1A+1B)=(1/(1+6.5))=1/7.5, the ratio between the two gain channels is also 6/(1/7.5)=45.

Figure 4:
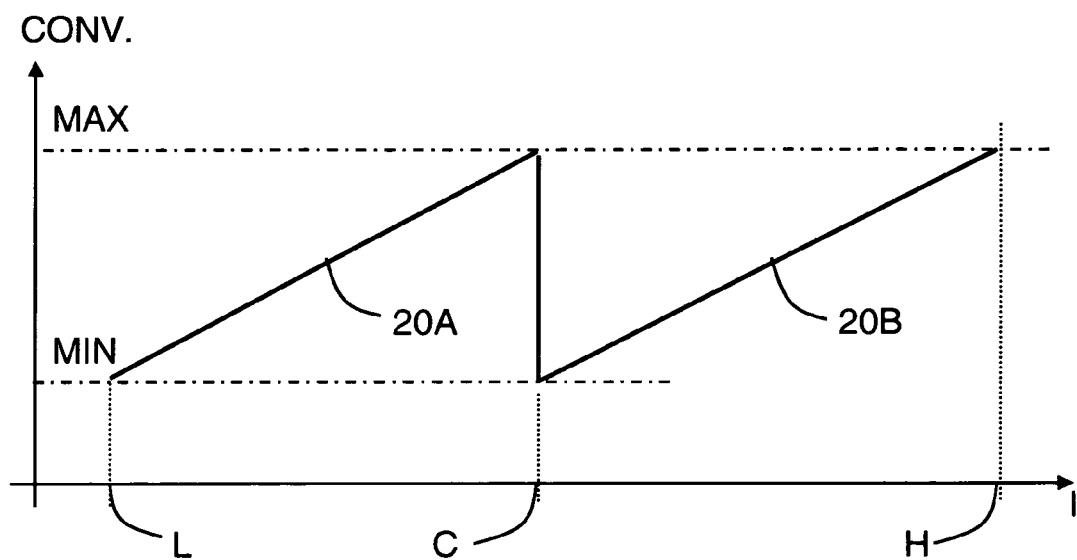
FIG. 4 represents curve plots of gain channels of a current measuring device according to an embodiment of the invention.

FIG. 4 shows plots of gain channels of a current measuring device according to an embodiment of the invention. This figure shows the conversion windows CONV of converters 3A and 3B between a minimum number of conversion points MIN and a maximum number of conversion points MAX corresponding to the maximum input signal of the converter. In these conversion windows, a first gain channel 20A has a high gain and operates between a minimum limit L of current to be measured and a switching point C, and a second gain channel 20B has a low gain or an attenuation and operates between the switching point C and a maximum limit H of current to be measured.

A measuring device as described above is particularly suitable for processing units for monitoring or protection of electrical switchgear. In this case, the processing unit comprises at least one current transformer 5 comprising a primary circuit to receive a primary current Ip to be measured and a secondary winding to supply a secondary measurement current Is representative of said current primary to be measured. A current measuring device is connected to the secondary winding of said current transformer to measure said secondary current and to provide a measurement signal representative of said secondary current Is. A processing circuit is connected to said measuring device to receive said measurement signal and process control/monitoring and protection functions. Signal converters 3A and 3B for analog-to-digital conversion can be integrated in processing circuit 7.

For high- or medium-voltage and/or strong-current switchgear apparatuses, the current transformer can be a channel with two or three current transformers. The currents to be measured can be phase or neutral polar currents or homopolar currents for example earth fault currents. In this case, the measuring ranges may be different.

The devices according to the invention can operate with very different measurement currents Is being able for example to be from a few milliamps to several amps in AC or DC.

In the embodiments described above, the series-connected measuring resistors are arranged in such a way that the second resistor of weak value 1B is connected to reference line 14. The order of the resistors can naturally be reversed with respect to the reference line. The two resistors can also be independent using in particular differential amplifiers for amplification of the signals.

The invention claimed is:

1. A current measuring device comprising:
   a first measuring resistor for receiving a measurement current,
   a first signal amplifier having an input connected to said first measuring resistor and an output for providing a first measurement signal,
   a second measuring resistor connected in series with said first measuring resistor, and
   first voltage limiting means connected in parallel to the first measuring resistor for branching a first shunt current off when a first limiting voltage is reached on said first measuring resistor,
   the value of the first measuring resistor being greater than the value of the second measuring resistor, and
   second voltage limiting means connected in parallel to the second measuring resistor for branching a second shunt current off when a second limiting voltage is reached on said second measuring resistor.

2. The measuring device according to claim 1 comprising a second signal amplifier connected to the second measuring resistor for providing a second measurement signal, said first amplifier having a higher gain than the gain of said second amplifier.

3. The measuring device according to claim 1 wherein the first limiting means has a limiting voltage of less than 1 volt for a shunt current of less than 1 amp.

4. The measuring device according to claim 3 wherein the first limiting means comprises two diodes connected head-to-tail in reverse parallel.

5. The measuring device according to claim 1 wherein the second limiting means has a limiting voltage of less than 2 volts for a shunt current of less than 2 amps.

6. The measuring device according to claim 5 wherein the second limiting means comprises two groups of two diodes in series connected head-to-tail in reverse parallel.

7. The measuring device according to claim 1 wherein a ratio between a first gain channel composed of the first measuring resistor, the second measuring resistor and the amplification of said first amplifier, and a second gain channel composed of the second measuring resistor and the amplification of said second amplifier is equal to approximately the square root of a dynamic measuring range defined by a maximum value of a current to be measured compared with a minimum value of a current to be measured.

8. The measuring device according to claim 1 wherein a ratio between a value of said first measuring resistor and a value of said second measuring resistor is between 5 and 15.

9. The measuring device according to claim 1 wherein a ratio between an amplification of said first amplifier and an amplification of the second amplifier or of the second gain channel is between 5 and 20.

10. A processing unit comprising:
    at least one current transformer comprising a primary circuit for receiving a primary current to be measured and a secondary winding for supplying a secondary measurement current representative of said primary current to be measured,
    at least one current measuring device connected to the secondary winding of said current transformer for measuring said secondary current and providing a measurement signal representative of the secondary current,
    processing means connected to said at least one current measuring device for receiving said measurement signal, wherein said at least one current measuring device is a measuring device according to claim 1 for receiving the secondary measurement current and providing:
    a first measurement signal representative of a current flowing in the first measuring resistor, and
    a second measurement signal representative of a current flowing in the second measuring resistor.

* * * * *